US007982514B2

(12) United States Patent
Biyani

(10) Patent No.: US 7,982,514 B2
(45) **Date of Patent: *Jul. 19, 2011**

(54) STATE-RETENTIVE MASTER-SLAVE FLIP FLOP TO REDUCE STANDBY LEAKAGE CURRENT

(75) Inventor: Manish Biyani, Chandler, AZ (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/821,869

(22) Filed: Jun. 23, 2010

(65) Prior Publication Data

US 2010/0259309 A1 Oct. 14, 2010

Related U.S. Application Data

(62) Division of application No. 12/018,734, filed on Jan. 23, 2008, now Pat. No. 7,768,331.

(60) Provisional application No. 60/887,238, filed on Jan. 30, 2007.

(51) Int. Cl.
*H03K 3/289* (2006.01)

(52) U.S. Cl. ....................................... 327/202; 327/203

(58) Field of Classification Search ................. 327/202, 327/203
See application file for complete search history.

(56) References Cited

U.S. PATENT DOCUMENTS 5,656,962 A 8/1997 Banik
2006/0273837 A1 12/2006 Shimazaki et al.

*Primary Examiner* — Lincoln Donovan
*Assistant Examiner* — John W Poos

(57) ABSTRACT

A system for storing state values during standby mode operation comprises a master flip flop that receives and stores state information during active mode operation and an associated slave flip flop that receives and stores state information during active mode and standby mode operation. The system further comprises a standby mode control circuit to control the state of the master and slave flip flops during active and standby mode operation based on at least two control signals. A first transfer gate determines the current flow to and from the master flip flop based on the output of the standby mode control circuit. Similarly, a second transfer gate determines current flow to and from the slave flip flop based on the output of the standby mode control circuit. A first power supply powers the master flip flop during active mode operation. Similarly, a separate always-on power supply powers the slave flip flop and standby mode control circuit during active mode and standby mode operation to enable state retention.

20 Claims, 5 Drawing Sheets

STATE-RETENTIVE MASTER-SLAVE FLIP FLOP TO REDUCE STANDBY LEAKAGE CURRENT

RELATED APPLICATIONS

This application is a Division of U.S. Ser. No. 12/018,734, filed Jan. 23, 2008, now U.S. Pat. No. 7,768,331 titled "State-Retentive Master-Slave Flip Flop to Reduce Standby Leakage Current", which claims the benefit of priority to U.S. Provisional Application No. 60/887,238, filed Jan. 30, 2007, titled "State Retentive Master Slave Flip Flop to Reduce Standby Leakage Current," each of which is herein incorporated by reference in its entirety.

FIELD OF THE INVENTION

The present invention is generally related to semiconductor integrated circuits and more specifically, to using a state-retentive master-slave flip flop to reduce standby mode leakage power.

BACKGROUND OF THE INVENTION

Portable consumer electronic devices continue to add features and capabilities to provide consumers better access to the growing availability of digital content. Consumers increasingly expect access to digital content wherever they go. The portability of digital content has created a demand for devices with increased functionality, reduced size, and extended battery life. Devices with greater functionality, however, often consume more power, reducing battery life.

Portable consumer electronic system designers and chip designers utilize a combination of hardware and software functionality to reduce the overall power consumption of these devices. Often, power consumption is separated into two states: active and standby. In the active state, the device operates at a specific frequency or multiple frequencies to perform a task. During the active state, power consumption can be separated into dynamic, or switching, power, and leakage power. Dynamic power results from transistors switching state, while leakage power is static, influenced by supply voltage, transistor switching threshold voltage, and temperature.

In 130 nm process geometries, dynamic power is typically the dominant component of active power. However, in 90 nm, 65 nm, and smaller process geometries, the leakage power component can be comparable to or greater than the dynamic power component. Smaller process geometries allow chips to run at the same frequency but with reduced voltage, thereby reducing dynamic power. In addition, the voltage threshold of the transistor are similarly reduced relative to the supply voltage. However, the aforementioned factors contributing to the reduction of dynamic power conversely cause an exponential increase in leakage power.

Leakage power, in addition to contributing to increased active power consumption, also increases standby power consumption, further reducing battery life. Particularly, in battery operated devices with a high ratio of standby to active operation, leakage current is the primary factor in determining overall battery life. In a standby mode, a device enters a sleep state by turning off all non-essential operations. However, during standby mode, essential functions, such as state retention logic, remain active.

Chip designers have implemented several techniques to reduce leakage power during standby mode operation. For example, some techniques use clock gating, multi-voltage threshold based designs, dynamic voltage threshold control, and power gating. Power gating, in particular, has become a common method of leakage power reduction used in low-power chip designs. In general, power gating involves disconnecting or reducing the power supply voltage to specific circuits. By isolating the power supply from these circuits, their respective leakage current paths are eliminated.

Generally speaking, low-power chip designs often isolate or disconnect the real or primary power supplies from particular circuits using a power gate device comprised of high-threshold transistors. The power gate device can be placed as a header, between the real power supply and the digital logic or, alternatively, as a footer between the digital logic and the return ground. Using high-threshold transistors reduces standby leakage current when the power gate device is off. The remaining logic, which often includes data registers comprised of master-slave flip flops, uses low-threshold devices to increase data throughput during active mode operation. During standby mode operation, the state of the of the master-salve flip flop must be retained to provide the processor a valid starting point to resume operations upon waking up. Applying power gating to data registers, however, prevents the master-slave flip flop from retaining the state information essential to resume normal operation when the device leaves the idle state or standby mode. As a result, an additional circuit, called a retention latch or balloon latch, is often coupled to the master-slave flip-flop to provide state retention during standby mode.

The retention latch is often comprised of high-threshold transistors used to reduce leakage current. In active operation, the power gate switch is on and the low-threshold master-slave flip flop samples its data input based on the appropriate clock edge, passing the sampled value to its output. The output of the master-slave flip flop is coupled to the input of the balloon latch. As the flip flop continuously samples and passes those values to its output, the value stored in the balloon latch changes accordingly. Prior to initiating standby mode, the real power supply is decoupled from the low-threshold power gate by switching the power gate off. As previously mentioned, a low-threshold power gate, used as a header, isolates the idle logic from the power supply during standby mode, eliminating the leakage path. The balloon latch remains coupled to the real power supply, maintaining the previous state value. When the active mode is resumed, the real power supply is recoupled to the master-slave flip flop by switching the power gate switch on. The processor resumes operation based on the value stored in the balloon latch.

Retention latches do, however, increase the circuit area and consume additional leakage power during standby and active operation. For some portable electronic devices, reduced device size is often an important feature. Minimal active and standby mode power consumption, similarly, is also a critical feature for these types of devices. For devices that have a high ratio of standby mode to active mode operation, such as smart phones and media players, reducing standby mode power consumption is essential to extending battery life. What is needed is a state-retentive flip flop with reduced area that minimizes leakage power consumption during standby mode operation.

SUMMARY

In accordance with at least one embodiment of the invention, a system for storing state values during standby mode operation comprises a positive-edge state-retentive master-slave flip flop. A master flip flop that receives and stores state information during active mode operation and an associated slave flip flop that receives and stores state information during active mode and standby mode operation. The system further comprises a standby mode control circuit to control the state of the master and slave flip flops during active and standby mode operation based on at least two control signals. A first transfer gate determines the current flow to and from the master flip flop based on the output of the standby mode control circuit. Similarly, a second transfer gate determines current flow to and from the slave flip flop based on the output of the standby mode control circuit. A first power supply powers the master flip flop during active mode operation. Similarly, a separate always-on power supply powers the slave flip flop and standby mode control circuit during active mode and standby mode operation to enable state retention.

In accordance with at least one embodiment of the invention, a system for storing state values during standby mode operation comprises a resetable negative-edge state-retentive master-slave flip flop. A master flip flop that receives and stores state information during active and standby mode operation and an associated slave flip flop that receives and stores state information during active mode operation. The system further comprises a standby mode control circuit to control the state of the master and slave flip flops during active and standby mode operation based on at least two control signals. A first transfer gate determines the current flow to and from the master flip flop based on the output of the standby mode control circuit. Similarly, a second transfer gate determines current flow to and from the slave flip flop based on the output of the standby mode control circuit. A first power supply powers the slave flip flop during active mode operation. Similarly, a separate always-on power supply powers the master flip flop and standby mode control circuit during active mode and standby mode operation to enable state retention.

In accordance with at least one embodiment of the invention, a method for storing state values during standby mode operation by receiving state values at a positive-edge state retentive master-slave flip flop based on at least two control signals, stopping a system clock, storing a current state value in a slave flip flop based on the output a standby mode control circuit, initiating standby mode operation by setting a standby mode control signal at a logic low and continuing to hold the system clock at a logic low, decoupling a master flip flop from the slave flip flop using a first transfer gate based on the output of the standby mode control circuit, disconnecting a first power supply from the master flip flop, and reducing the output power level of a second always-on power supply.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

DETAILED DESCRIPTION

Reference will now be made in detail to embodiments of the invention illustrated in the accompanying drawings. Wherever possible, the same reference numbers will be used throughout to refer to the same or like parts.

Figure 1:
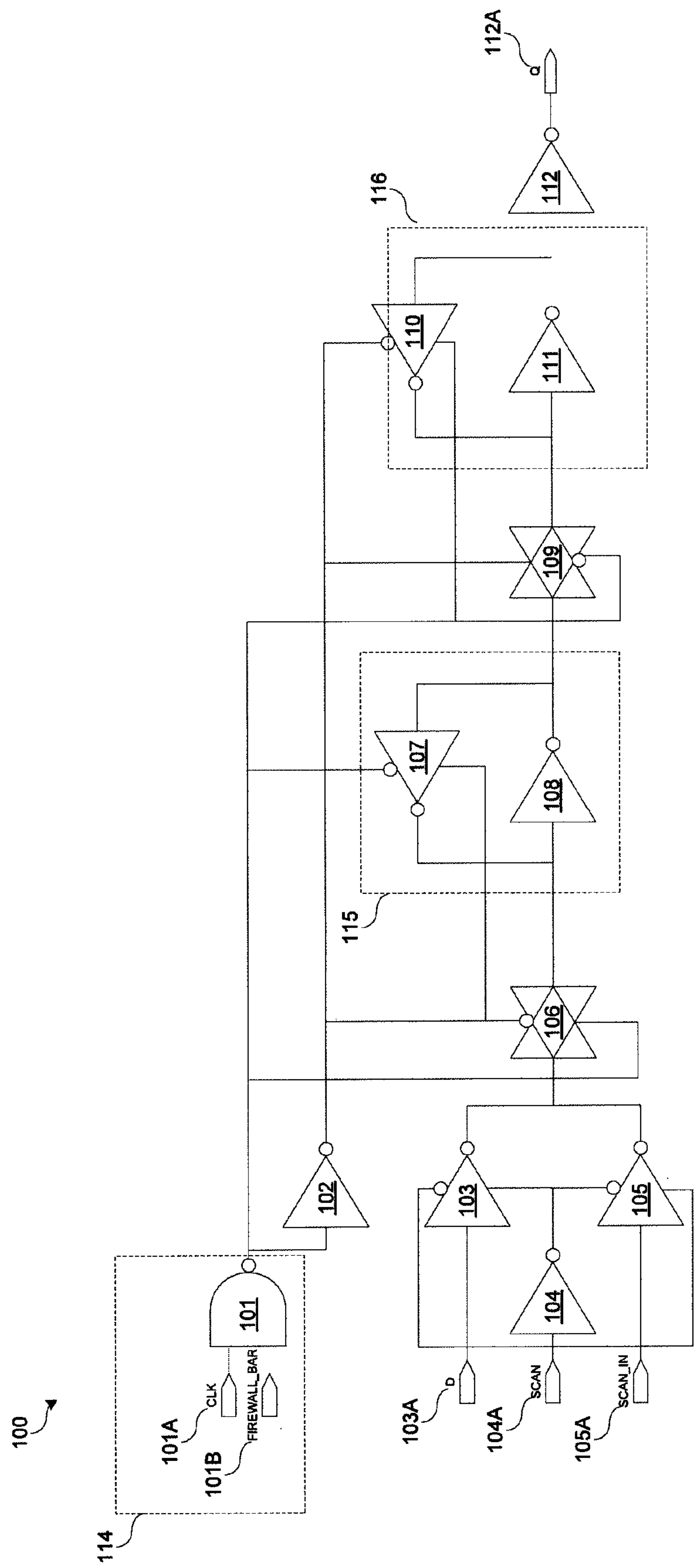
FIG. 1 illustrates a schematic for an exemplary positive-edge state-retentive master-slave flip flop

FIG. 1 illustrates a schematic for an exemplary positive-edge state-retentive master-slave flip flop. Here, state-retentive master-slave flip-flop 100 includes master flip flop 115, slave flip flop 116, and transfer gate control circuitry 114. Slave flip flop 116 and transfer gate control circuitry 114 are coupled to an always-on power supply vcc_udr (not illustrated). Master flip flop 115 and all remaining digital logic depicted in FIG. 1 are coupled to a primary power supply vcc. Transfer gate control circuitry 114, as depicted in FIG. 1, includes nand gate 101, with inputs CLK 101A and firewall_bar 101B. Based on the logic levels of inputs CLK 101A and firewall_bar 101B, the output of nand gate 101 and inverter 102 control the state of transfer gates 106 and 109 and clocked-inverters 107 and 110. Nand gate 101 is coupled to the vcc_udr power supply to ensure that transfer gate 109 remains off when the vcc power supply is disconnected. In some embodiments, an inverter and pull-down devices are used rather than nand gate 101 to provide the same functionality. Master flip flop 115 includes inverter 108 and clocked-inverter 107. The input of inverter 108 is coupled to the output of transfer gate 106. The output of inverter 108 is coupled to both the input of transfer gate 109 and the input of clocked-inverter 107. The output of clocked inverter 107 is coupled to the input of inverter 108, providing feedback to store received state data in master flip flop 115.

During active mode operation, the sequential flip flops 115 and 116 function as a positive-edge master-slave flip flop. The power supply vcc remains coupled to master flip flop 115 and all other circuit elements depicted in FIG. 1, excluding transfer gate control circuitry 114 and slave flip flop 116. Transfer gate control circuitry 114 and slave flip flop 116 are coupled to power supply vcc_udr during both active mode and standby mode operation. The input firewall_bar 101B is held at a logic high. As long as firewall_bar 101B is held at a logic high, nand gate 101 acts like an inverter, with input CLK 101A. If CLK 101A is a logic high, while firewall_bar 101B is held at a logic high, the output of nand gate 101 will be a logic low and the output of inverter 102 will be a logic high. Similarly, if CLK 101A is a logic low, while firewall_bar 101B is held at a logic high, the output of nand gate 101 will be a logic high and the output of inverter 102 will be a logic low. The output of nand gate 101 and inverter 102 determines whether the master or slave flip flop is enabled or disabled during active mode operation.

During active mode operation, input D 103A of inverter 103 provides the input to the master flip flop, gated through transfer gate 106. During the rising edge of CLK 101A, the output of nand gate 101 becomes a logic low and the output of inverter 102 becomes a logic high, causing transfer gate 106 to turn off, disabling the master flip flop 115. The slave latch 116, however, is enabled because transfer gate 109 is turned on. Here, the value at the output of the master flip flop 115, represented by the output of inverter 108, remains stable, using clocked inverter 107 as feedback to maintain the state. The output of inverter 108 passes through transfer gate 109, providing an input to slave flip flop 116. In slave flip flop 116, the output clocked inverter 110 floats, allowing the value at the output of inverter 108 to pass to the output of the slave flip flop 116, represented by the output Q 112A of inverter 112.

During the falling edge of CLK 101A in active mode operation, the output of nand gate 101 becomes a logic high and the output of inverter 102 becomes a logic low, causing transfer gate 106 to turn on, enabling the master flip flop 115. Slave latch 116, however, is disabled because transfer gate 109 is turned off. Here, clocked inverter 103 inverts input D 103A, which passes through transfer gate 106 to the input of the master flip flop 115, represented by the input of inverter 108. The output of clocked inverter 107 of master flip flop 115 floats, allowing the output of inverter 108 to track input D 103A. Transfer gate 109 is turned off. Slave latch 116 is disabled, maintaining the previous output value, using clocked inverter 110 as feedback to maintain the state.

During standby mode operation, the device or processor enters a low power mode by shutting down non essential operations, such as disk drives, displays, and system clocks. In FIG. 1, to enter standby mode, CLK 101A is held at a logic low. Next, firewall_bar 101B is asserted low, causing the output of nand gate 101 to become a logic high and the output of inverter 102 to become a logic low. The output of nand gate 101 and the output of inverter 102 control the operation of transfer gates 106 and 109. After firewall_bar 101B is asserted low, the primary power supply vcc is turned off, removing power from all digital logic excluding nand gate 101A and slave flip flop 116. By turning off vcc, the leakage paths for all non-essential digital logic is significantly reduced. Vcc_udr remains coupled to nand gate 101A. To further reduce leakage power the output level of vcc_udr can be lowered to a minimum voltage level sufficient to power nand gate 101A and slave flip flop 116. Nand gate 101 must remain powered on during standby mode to ensure that transfer gate 109 remains off to prevent corruption of the state stored in slave flip flop 116. Slave flip flop 116 acts as the state-retentive element of the master-slave flip flop. Clocked-inverter 110 provides a feedback loop to store the state prior to entering standby mode. Inverter 112 is not powered, which reduces the leakage path from the output of slave flip flop 116 during standby mode.

Figure 2:
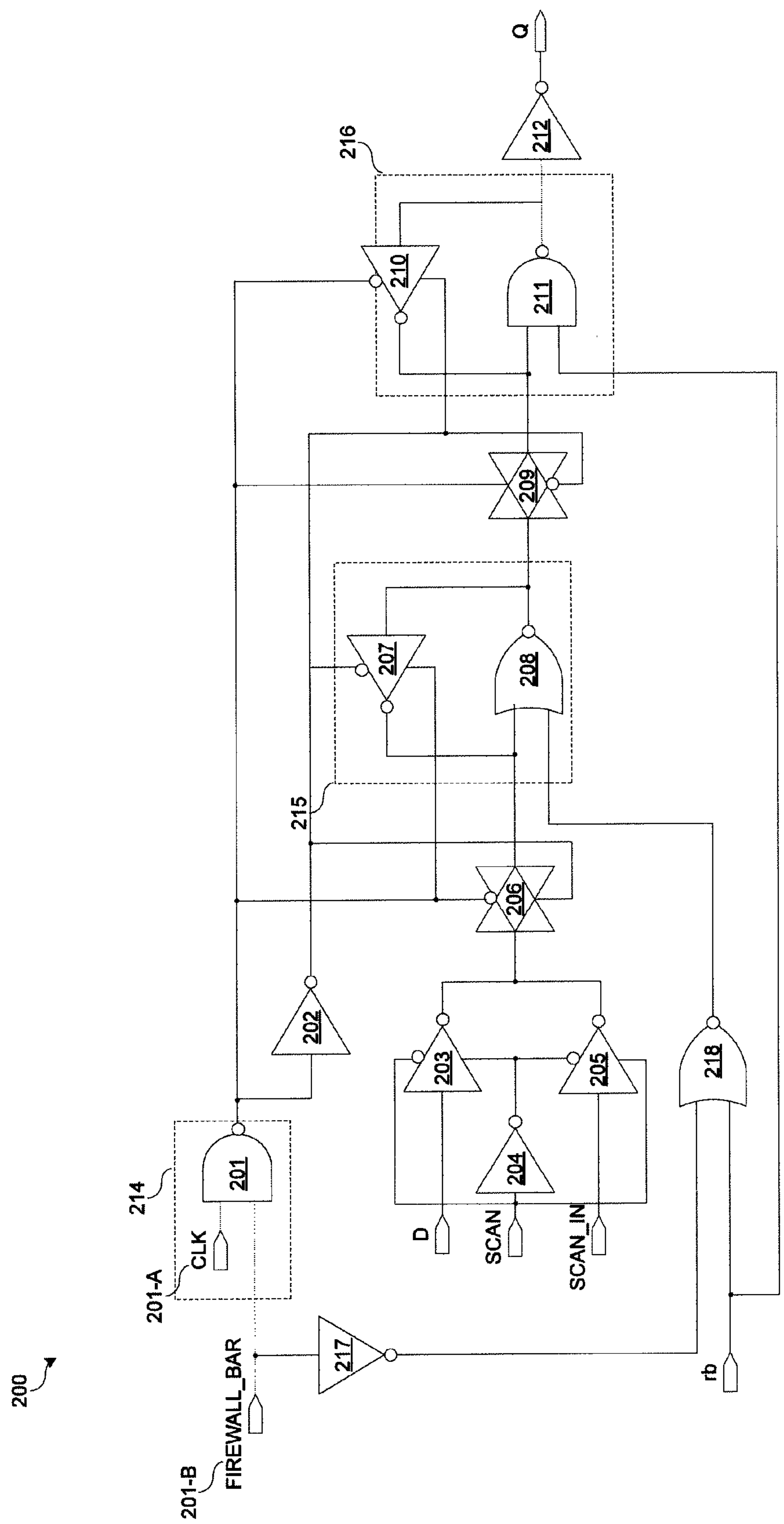
FIG. 2 illustrates a schematic for an exemplary negative-edge state-retentive master-slave flip flop.

FIG. 2 illustrates a schematic for an exemplary resetable negative-edge state-retentive master-slave flip flop. Here, state-retentive master-slave flip-flop 200 includes master flip flop 215, slave flip flop 216, and transfer gate control circuitry 214. Master flip flop 215 and transfer gate control circuitry 214 are coupled to always-on power supply vcc_udr. Slave flip flop 216 and all remaining digital logic depicted in FIG. 2 are coupled to primary power supply vcc. Transfer gate control circuitry 214, as depicted in FIG. 2, includes nand gate 201, with inputs CLK 201A and firewall_bar 201B. Based on the logic levels of the inputs CLK 201A and firewall_bar 201B, the outputs of nand gate 201 and inverter 202 control the state of transfer gates 206 and 209 and clocked-inverters 207 and 210. Nand gate 201 is coupled to the vcc_udr power supply in order to ensure that transfer gate 206 remains off when the vcc power supply is disconnect. In some embodiments, an inverter and a pull-down device are used rather than nand gate 101 to provide the same functionality. Master flip flop 215 includes nor gate 208 and clocked-inverter 207. The input of nor gate 208 is coupled to the output of transfer gate 206. The output of nor gate 208 is coupled to both the input of transfer gate 209 and the input of clocked-inverted 207. The output of clocked-inverter 207 is coupled to the input of nor gate 208, providing feedback to store received state data in master flip flop 215.

During active mode operation, the sequential flip flops 215 and 216 function as a resetable negative-edge master-slave flip flop 200. The primary power supply vcc remains coupled to slave flip flop 216 and all other elements depicted in FIG. 2, excluding transfer gate control circuitry 214, master flip flop 215, and inverter 217. Transfer gate control circuitry 214, master flip flop 215, and inverter 217 are coupled to vcc_udr during both active mode and standby mode operation. Firewall_bar 201B is held at a logic high. Because firewall_bar 201B is held at a logic high during active mode operation, nand gate 201 acts like an inverter, with input CLK 201A. For example, If CLK 201A is a logic high, the output of nand gate 201 will be a logic low and the output of inverter 202 will be a logic high. Similarly, if CLK 201A is a logic low, the output of nand gate 201 will be a logic high and the output of inverter 202 will be a logic low. As illustrated in FIG. 1, the output of nand gate 201 and the output of inverter 202 determine whether the master or the slave flip flop is enabled or disabled during active mode operation by controlling the state of transfer gates 206 and 209.

In active mode operation, when CLK 210A becomes a logic high, the output of nand gate 201 becomes a logic low and the output of inverter 202 becomes a logic high. Because firewall_bar is held at a logic high during active mode operation, the output of inverter 217 remains a logic low. Transfer gate 206 turns on, allowing the input of inverter 203 to reach the input of master flip flop 215. The two inputs of nor gate 208 serve as the inputs of master flip flop 215. One input of nor gate 208 is coupled to the output of transfer gate 206 and the other input is coupled to the output of nor gate 218. The output of inverter 217 is coupled to one of the inputs of nor gate 218, while the remaining input of nor gate 218 is coupled to an asynchronous reset signal. Setting the asynchronous reset signal to a logic low sets the output values of the master and slave flip flops to zero regardless of the state of the clock edge. However, while the asynchronous reset signal remains at a logic high, the output of nor gate 218 is held at a logic low, which causes nor gate 208 to operate as an inverter. Clocked-inverter 207 turns off, causing master flip flop 215 to operate as a transparent latch, tracking the value of the input of inverter 203. Slave flip flop 216, in contrast, holds its previously stored value, regardless of the value at the input of inverter 203. Transfer gate 209 is turned off, isolating the output of master flip flop 215 from the slave flip flop 216. The two inputs of nand gate 211 serve as the inputs to slave flip flop 216. One input of nand gate 211 is coupled to the output of slave flip flop via transfer gate 209, while the remaining input of slave flip flop 216 is coupled to the asynchronous reset signal. The asynchronous reset signal remains at a logic high unless a reset is initiated by a user, a program, or an external signal. While the asynchronous reset signal remains at a logic high, nand gate 211 operates as an inverter. Clocked-inverter 210 turns on, providing a feed back loop to maintain the previously stored state value.

In active mode operation, when CLK 210A becomes a logic low, the master flip flop holds its previously stored value and slave flip flop 216 operates as a transparent latch. Here, the output of nand gate 201 becomes a logic high and the output of inverter 202 becomes a logic low. Transfer gate 206 turns off, isolating the input of inverter 203 from the input of master flip flop 215. Clocked-inverter 207 turns on, providing a feedback loop to maintain the previously stored state value, regardless of the value at the input of inverter 203. The slave flip flop 216, in contrast, operates as a transparent latch, with clocked inverter 210 turned off. Transfer gate 209 is turned on, coupling the output of master flip flop 215 to an input of slave flip flop 216. The remaining input of slave flip flop 216 is coupled to the asynchronous reset signal, as previously discussed. The input of inverter 212 is coupled to the output of nand gate 211, generating the output of state-retentive master-slave flip flop 200.

In FIG. 2, during the standby mode, CLK 201A is held at a logic low. Next, firewall_bar 201B is asserted low, causing the output of nand gate 201 to become a logic high, the output of inverter 202 to become a logic low, and the output of inverter 217 to become a logic high. As previously discussed, the output of nand gate 201 and the output of inverter 202 control the state of transfer gates 206 and 209. After firewall_bar 201B is asserted low, power supply vcc is turned off, removing power to all digital logic excluding nand gate 201A, master flip flop 215, and inverter 217. Vcc_udr remains coupled to nand gate 201A, inverter 217, and master flip flop 215. To further reduce leakage power the output level of vcc_udr can be lowered to minimum voltage level sufficient to power nand gate 201A, master flip flop 215, and inverter 217. Nand gate 201 must remain powered on during standby mode to ensure that transfer gate 206 remains off to prevent corruption of the state stored in master flip flop 215. Clocked-inverter 207 provides a feedback loop to store the previous state value. Transfer gate 209 remains on, and coupled to the output of master flip flop 215 via the output of nor gate 208. Because the elements comprising slave flip flop 216 and inverter 212 are not powered, the leakage path from the output of slave flip flop 216 is significantly reduced.

In some embodiments, further reduction in leakage power previously described may be obtained by using a low-leakage semiconductor fabrication process. A low-leakage semiconductor fabrication process often comprises inherently low-leakage transistors specifically designed to reduce leakage power. In other embodiments, leakage power can be reduced using high-threshold transistor devices to construct the state retentive flip flop element.

Figure 3:
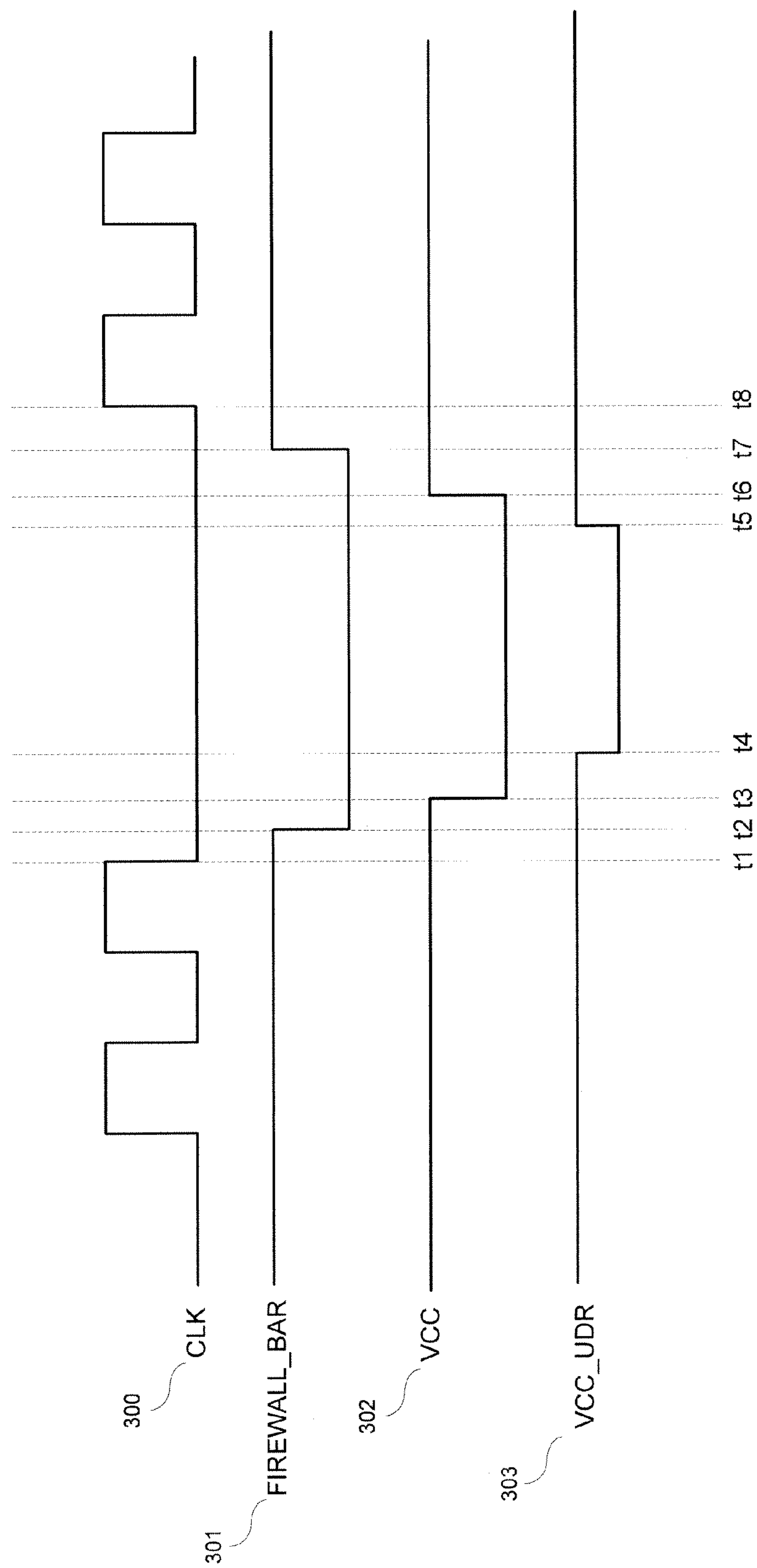
FIG. 3 illustrates an exemplary timing waveform describing active and standby mode operation of an exemplary master-slave state retentive flip-flop.

FIG. 3, depicts an exemplary timing waveform illustrating active and standby mode operation. During active mode operation, CLK 300 operates as clock signal, toggling between logic low and high states at a fixed frequency. Firewall_bar 301 is maintained at a logic high. Power supplies vcc 302 and vcc_udr 303 are on. At time $t_1$, CLK is held low in order to enter standby mode. At time $t_2$, firewall_bar is asserted low. Power supply vcc 302 is turned off at time $t_3$. At time $t_4$, the voltage level vcc_udr 303 is lowered to a level sufficient to maintain the state value as previously discussed. During wake-up mode, the operation is reversed. At time $t_5$, vcc_udr 303 is raised to its maximum output voltage level. Power supply vcc 302 is turned on at time t6. At time $t_7$, firewall_bar 301 is asserted to a logic high. CLK 300 is turned on at time $t_8$, allowing the device to resume operation based on the retained state values.

Figure 4:
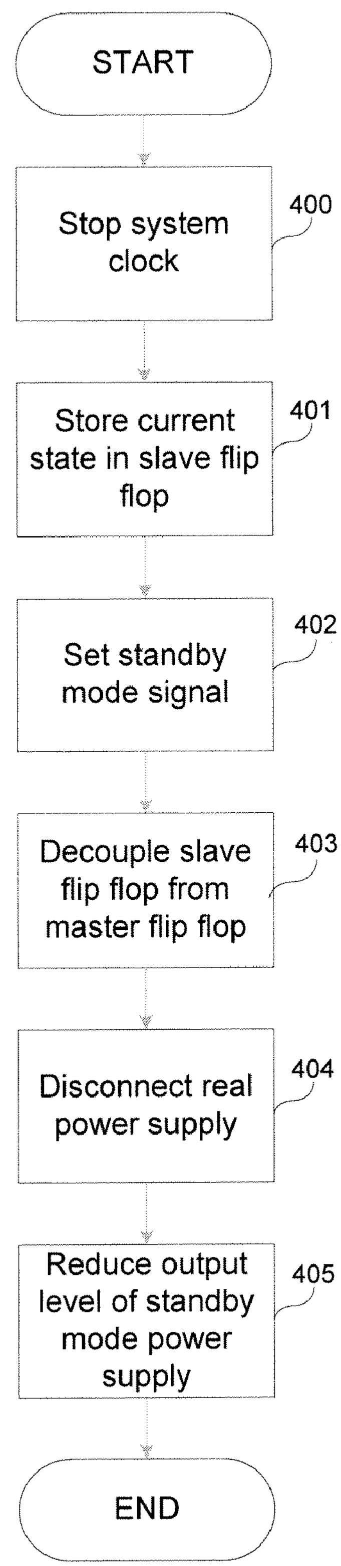
FIG. 4 illustrates a flowchart of an exemplary method of standby mode operation of an exemplary negative-edge state-retentive master-slave flip flop.

FIG. 4 illustrates a flowchart of an exemplary method of standby mode operation of a positive-edge state-retentive master-slave flip flop. In step 400, the system clocks are turned off, causing the processor, memory, and other logic blocks to stop operating. In step 401, the slave flip flop holds the current state value triggered by system clock held low. In step 402, the standby mode signal is set by a user, program, another device, or other external signal. Here, by asserting firewall_bar low the device initiates standby mode operation. In step 403, the slave flip flop, acting as the state-retentive element, is decoupled from the master flip flop, triggered by setting the standby mode signal. Here, the standby mode signal and the system clock provide inputs to the standby mode logic block that controls the state of transfer gates, which separate the elements of the state retentive master-slave flip flop. In step 404, the real power supply is decoupled to reduce leakage power dissipation from all non essential digital logic. In step 405, the standby mode power supply's output level is reduced to a level sufficient to maintain the state retentive slave flip-flop and the associated standby mode control circuitry.

Figure 5:
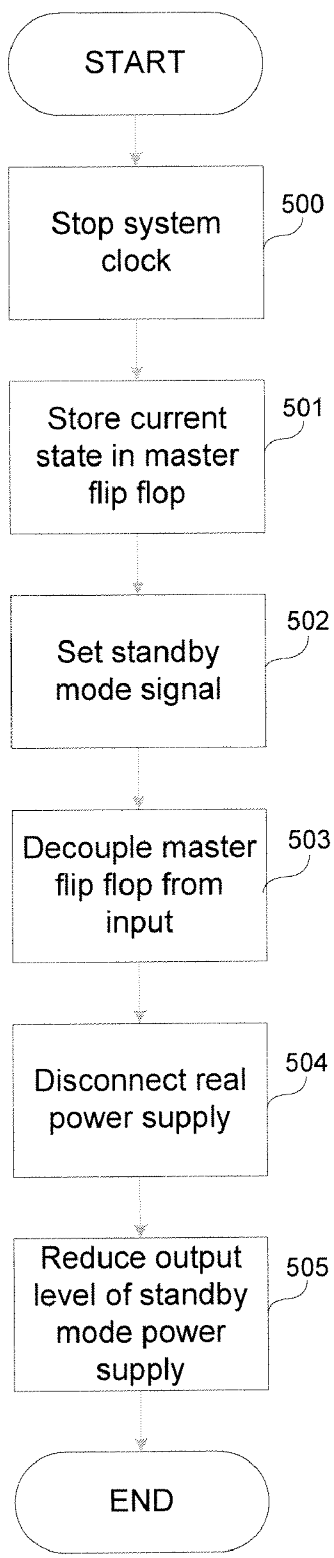
FIG. 5 illustrates a flowchart of an exemplary method of standby mode operation of an exemplary positive-edge state-retentive master-slave flip flop.

FIG. 5 illustrates a flowchart of an exemplary method of standby mode operation of a negative-edge state-retentive master-slave flip flop. In step 500, the system clocks are turned off, causing the processor, memory, and other logic blocks to stop operating. In step 501, the master flip flop holds the current state value triggered by system clock held low. In step 502, the standby mode signal is set by a user, program, another device or other external signal. Here, by asserting firewall_bar low the device initiates standby mode operation. In step 503, the master flip flop, acting as the state-retentive element, is decoupled from the input of the master-slave flip flop, triggered by setting the standby mode signal. Here, the standby mode signal and the system clock provide inputs to the standby mode logic block that controls the state of transfer gates, which separate the elements of the state retentive master-slave flip flop and the input to the master-slave flip flop. In step 504, the real power supply is decoupled to reduce leakage power dissipation from all non essential digital logic. In step 505, the standby mode power supply's output level is reduced to a level sufficient to maintain the state retentive master flip-flop and the associated standby mode control circuitry.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:

a master flip flop that receives and stores state information during active mode and standby mode operation from a plurality of input signals;

a slave flip flop that receives and stores state information during active mode operation from the master flip flop;

a standby mode control circuit that controls the state of the master and slave flip flops during active and standby mode operation based on at least two control signals, wherein the control signals include, a clock input signal and a standby mode control input signal used in combination to generate a standby mode control output signal;

a first transfer gate for controlling power to the master flip flop based on the standby mode control output signal;

a second transfer gate for controlling power to the slave flip flop based on the standby mode control output signal;

at least one power supply that supplies the slave flip flop during active mode operation and that supplies the master flip flop and the standby mode control circuit during active mode and standby mode operation.

2. The system of claim 1, wherein the standby mode control circuit generates the standby mode control output signal for selecting an operating state of the first transfer gate, the second transfer gate, and operating modes of the master and slave flip flops.

3. The system of claim 1, wherein the master flip flop receives a plurality of input signals via an output of the first transfer gate, the input signals include at least a data input signal and a scan input signal.

4. The system of claim 1, further comprising:

a first inverter for inverting an output of standby mode control circuit.

5. The system of claim 4, further comprising:

a second inverter for inverting the standby mode control input signal.

6. The system of claim 5, further comprising:

a third inverter for inverting an output of the slave flip flop for generating an output signal of a negative-edge state-retentive master-slave flip flop.

7. The system of claim 4, wherein the first transfer gate further comprises:

a first control input, coupled to an output of the standby mode control circuit, for selecting an operating mode of the first transfer gate; and a second control input, coupled to an output of the first inverter for selecting the operating mode of the first transfer gate, wherein an input of the first inverter is coupled to the output of the standby mode control circuit.

8. The system of claim 1, wherein the standby mode control circuit includes at least one static logic gate to generate the standby mode control circuit output signal.

9. The system of claim 1, wherein the standby mode control circuit includes a plurality of pull-up devices and an inverter to generate the output of the standby mode control circuit.

10. The system of claim 1, wherein the master flip flop further comprises:

a reset input for receiving a reset signal; and a clocked-inverter to determine an operating mode based on the output of the standby mode control circuit.

11. The system in claim 10, wherein the operating mode includes transparent and store modes.

12. The system of claim 1, wherein the slave flip flop further comprises:

a reset input for receiving a reset signal; and a clocked-invert to determine an operating mode based on the output of the standby mode control circuit.

13. The system in claim 12, wherein the operating mode includes transparent and store modes.

14. The system of claim 5, further comprising:

a nor gate used to generate a reset signal for the master and slave flip flops based on a reset input signal and an output of the second inverter.

15. The system of claim 1, wherein the at least one power supply is configured to have varying output levels including a typical output level and a reduced output level.

16. A method comprising:

receiving state value at a master-slave flip flop based on at least two control signals, wherein the control signals include a system clock and a standby mode control signal;

stopping the system clock, wherein the system clock is held at a logic low or a logic high;

storing a current state value in the master-slave flip flop based on an output of a standby mode control circuit;

initiating standby mode operation by setting the standby mode control signal at a logic low and continuing to hold the system clock at the logic low or the logic high;

decoupling the master flip flop from a plurality of inputs using a first transfer gate based on the output of the standby mode control circuit;

disconnecting a first power supply from the mater-slave flip flop; and reducing an output power level of a second power supply to further reduce leakage power.

17. The method of claim 16, wherein storing the current state value in the master flip flop based on the output of the standby mode control circuit includes operating the master flip flop in a store mode.

18. The method of claim 17, wherein operating the master flip flop in store mode includes operating a first clocked-inverter as an inverter based on the output of the standby mode control circuit and an output of a first inverter, wherein the first inverter inverts the output of the standby mode control circuit.

19. The method of claim 18, wherein decoupling the master flip flop from the plurality of inputs using the first transfer gate includes turning off the first transfer gate using the outputs of the standby mode control circuit and the first inverter.

20. The method of claim 16, wherein reducing the output power level of a second power supply includes reducing the output power to a minimum level based on power requirements of the slave flip flop and standby mode control circuit.

* * * * *